United States Patent
Nagamori et al.

(10) Patent No.: US 9,485,881 B2
(45) Date of Patent: Nov. 1, 2016

(54) INVERTER COVER

(71) Applicants: MITSUBISHI JIDOSHA KOGYO KABUSHIKI KAISHA, Tokyo (JP); MITSUBISHI JIDOSHA ENGINEERING KABUSHIKI KAISHA, Okazaki-shi, Aichi (JP)

(72) Inventors: Takeo Nagamori, Toyota (JP); Masaru Ohkado, Okazaki (JP); Katsumi Nishimura, Ichinomiya (JP); Toshihiko Ando, Toyota (JP); Shoji Tanizawa, Kasugai (JP)

(73) Assignees: Mitsubishi Jidosha Kogyo Kabushiki Kaisha, Tokyo (JP); Mitsubishi Jidosha Engineering Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/401,449

(22) PCT Filed: May 10, 2013

(86) PCT No.: PCT/JP2013/063185
§ 371 (c)(1),
(2) Date: Nov. 14, 2014

(87) PCT Pub. No.: WO2013/172272
PCT Pub. Date: Nov. 21, 2013

(65) Prior Publication Data
US 2015/0121767 A1 May 7, 2015

(30) Foreign Application Priority Data
May 17, 2012 (JP) ................. 2012-113164

(51) Int. Cl.
H05K 5/03 (2006.01)
B60K 1/00 (2006.01)
B62D 25/08 (2006.01)

(52) U.S. Cl.
CPC . *H05K 5/03* (2013.01); *B60K 1/00* (2013.01); *B60Y 2306/01* (2013.01); *B62D 25/081* (2013.01)

(58) Field of Classification Search
CPC ...... Y02T 10/7077; H05K 5/03; B60K 1/00; B62D 25/081; B62D 25/082; B62D 5/0406; B60R 2021/343; B60R 21/34
USPC ..................................... 123/198 E
See application file for complete search history.

(56) References Cited

U.S. PATENT DOCUMENTS 4,909,566 A * 3/1990 Hashimoto ............ B60H 1/24
296/192
6,883,628 B1 * 4/2005 Mizukami ........... B60R 16/0315
180/291

(Continued)

FOREIGN PATENT DOCUMENTS

JP 11-30393 A 2/1999
JP 2003-320854 A 11/2003

(Continued)

*Primary Examiner* — Justin Rephann
(74) *Attorney, Agent, or Firm* — Birch, Stewart, Kolasch & Birch, LLP

(57) ABSTRACT

An inverter cover for covering an inverter provided in a front space which is formed in front of a vehicle room in a longitudinal direction of the vehicle, by partitioning the vehicle room with a vehicle body panel, includes: a body part for covering an upper face of the inverter; and an extended part extended rearward from the body part so as to be positioned between a connecting part which is provided in a rear part of the inverter and to which a harness is connected, and an edge part which is protruded frontward from the vehicle body panel.

5 Claims, 3 Drawing Sheets

(56) References Cited

U.S. PATENT DOCUMENTS

| | | | |
|---|---|---|---|
| 8,646,832 B2* | 2/2014 | Yamashita | B60R 19/18 296/192 |
| 2007/0115707 A1* | 5/2007 | Koide | F04B 35/04 363/146 |
| 2010/0116571 A1* | 5/2010 | Suzuki | B60L 11/1877 180/65.25 |
| 2011/0139595 A1 | 6/2011 | Ishigaki | |
| 2012/0104886 A1* | 5/2012 | Yamasaki | B62D 5/0406 310/71 |
| 2012/0118653 A1 | 5/2012 | Ogihara et al. | |
| 2012/0160596 A1* | 6/2012 | Yamasaki | B62D 5/0406 180/443 |
| 2013/0049550 A1* | 2/2013 | Watanabe | F04B 39/121 310/67 R |
| 2013/0242484 A1* | 9/2013 | Schweichart | H05K 5/03 361/679.01 |
| 2013/0284487 A1* | 10/2013 | Izawa | H01B 7/29 174/107 |
| 2014/0345960 A1* | 11/2014 | Yamanaka | B60L 11/1803 180/65.8 |

FOREIGN PATENT DOCUMENTS

| | | |
|---|---|---|
| JP | 2005-327991 A | 11/2005 |
| JP | 3780972 B2 | 5/2006 |
| JP | 2006-335098 A | 12/2006 |
| JP | 2011-125183 A | 6/2011 |
| JP | 2013-112237 A | 6/2013 |
| WO | 2011/013717 A1 | 2/2011 |
| WO | 2011/099429 A1 | 8/2011 |

* cited by examiner

FRONT ←→ REAR

INVERTER COVER

TECHNICAL FIELD

The present invention relates to an inverter cover for covering an upper side of an inverter which supplies alternating current to a driving motor for driving a vehicle.

BACKGROUND ART

As a motor-driven car such as an electric car or a hybrid car which uses a driving motor as a drive source, there has been provided such a car that an inverter for converting direct current of a high voltage battery to alternating current to be supplied to the driving motor for driving a vehicle is arranged in a front space in front of a vehicle room.

A harness for interconnecting the inverter and the high voltage battery, a harness for interconnecting the inverter and the driving motor, and so on are connected to a rear part of the inverter.

For the purpose of securing waterproofing and electromagnetic shielding of such an inverter, an inverter cover for covering an upper side of the inverter has been heretofore provided (refer to Patent Document 1).

PRIOR ART DOCUMENT

Patent Document

Patent Document 1: JP-A-2003-320854

SUMMARY OF THE INVENTION

Problems that the Invention is to Solve

By the way, in case where, when another vehicle or an object collides against the front part of the vehicle from a front side, a front part of a vehicle body is deformed and the inverter is displaced rearward inside the front space, the harness which is connected to the rear part of the inverter is also displaced rearward, following the inverter.

Then, the harness which is displaced rearward may come into contact with an edge part of a vehicle body panel which is positioned behind the harness and functions as a partition between a rear part of the front space and the vehicle room. This is disadvantageous in maintaining durability of the harness.

This invention has been made in view of the above described circumstances, and an object of the invention is to provide an inverter cover which is advantageous in maintaining durability of a harness.

Means for Solving the Problems

In order to attain the above described object, there is provided, according to the invention, an inverter cover for covering an inverter provided in a front space which is formed in front of a vehicle room in a longitudinal direction of the vehicle, by partitioning the vehicle room with a vehicle body panel, the inverter cover characterized by comprising: a body part for covering an upper face of the inverter; and an extended part extended rearward from the body part so as to be positioned between a connecting part which is provided in a rear part of the inverter and to which a harness is connected, and an edge part which is protruded frontward from the vehicle body panel.

Advantage of the Invention

According to the foregoing first aspect of the invention, in the event of collision, the harness connecting part provided in the rear part of the inverter and a part of the harness connected to the inverter are indirectly butted against the edge part, via the extended part of the inverter cover which is positioned between the connecting part and the edge part. This is advantageous in maintaining durability of the harness.

According to the second aspect of the invention, in the event of collision, the extended part is likely to be curved downward, and the part of the harness connected to the rear part of the inverter is enveloped in the slanted part. As the results, the harness connecting part and the harness are protected by the extended part, which is advantageous in maintaining the durability of the harness.

According to the third aspect of the invention, the extended part is likely to be curved downward from a border with the body part at a rearward position than the connecting part (the harness connecting connector). Therefore, in the event of collision, the part of the harness connected to the rear part of the inverter is enveloped in the extended part, and the harness is protected by the extended part. As the results, the durability of the harness can be advantageously maintained.

According to the fourth aspect of the invention, in case where the vehicle comes into collision and the bent part is butted against the vehicle body panel, the extended part is likely to be curved downward, and the harness is enveloped in the extended part. As the results, the harness is protected by the extended part, and the durability of the harness can be advantageously maintained.

MODE FOR CARRYING OUT THE INVENTION

Figure 1:
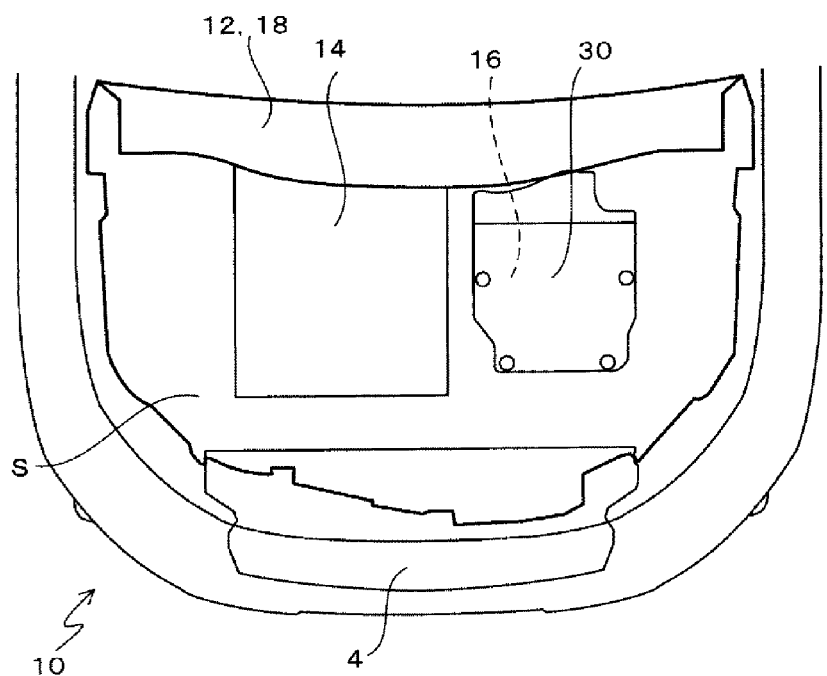
FIG. 1 is a plan view of a front part of a vehicle 10 in which an inverter cover 30 according to an embodiment of the invention is mounted on an inverter 16.

Now, an embodiment of the invention will be described referring to the drawings.

In this embodiment, description will be made referring to a case where the vehicle 10 is a hybrid car which uses an engine and a driving motor as drive sources.

Figure 3A:
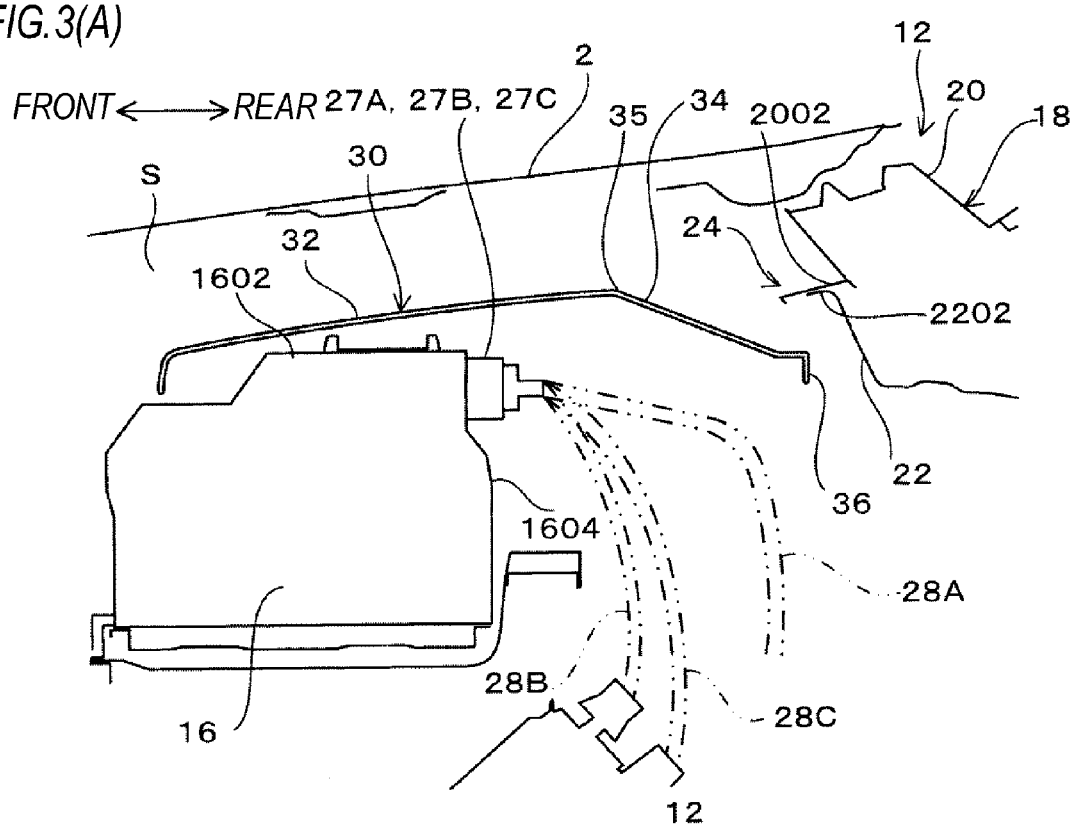
FIG. 3(A) is a sectional view taken along a line A-A in FIG. 2.

As shown in FIG. 1, the vehicle 10 has a front space S which is partitioned by a vehicle body panel 12, in front of a passenger compartment, and the front space S is opened or closed with a hood 2 (See FIG. 3(A)).

A radiator 4 is arranged in a front part of the front space S, and an engine 14 as the drive source and an inverter 16 are arranged in rear of the radiator 4.

A direct current is supplied to the inverter 16 from a battery which is not shown, and converted to a three-phase alternating current, for example, in the inverter 16 to be supplied to the driving motor which is not shown.

As shown in FIG. 3(A), the vehicle body panel 12 includes a dash panel which is not shown, and a cowl top 18.

The dash panel mainly functions as a partition between the passenger compartment and the front space S. A lower end of the dash panel is connected to a front end of a floor for partitioning a lower part of the vehicle room.

The cowl top 18 is a member which is positioned above the dash panel, and supports a front glass.

The cowl top 18 includes an upper cowl top 20 and a lower cowl top 22.

The cowl top 18 which is formed of a steel sheet is connected to an upper end of the dash panel to be extended in a lateral direction of the vehicle, and supports a lower end of the front glass which is not shown.

The upper cowl top 20 is extended in the lateral direction of the vehicle along the lower end of the front glass.

The lower cowl top 22 is extended in the lateral direction of the vehicle below the upper cowl top 22.

In this embodiment, a joint part between a flange 2002 in a lower part of the upper cowl top 20 and a flange 2202 in an upper part of the lower cowl top 22 constitute an edge part 24 protruding toward the front space S. Therefore, the edge part 24 is positioned above the vehicle body panel 12, in this embodiment.

Figure 2:
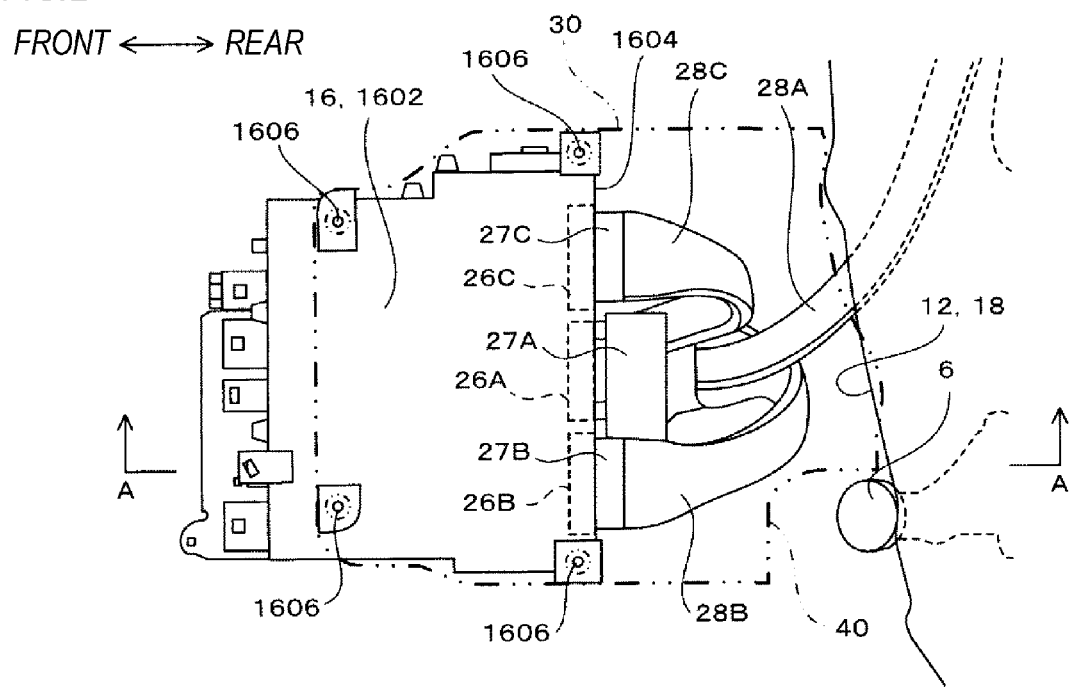
FIG. 2 is a plan view showing positional relation between the inverter 16, the inverter cover 30, and first to third harnesses 28A, 28B, 28C.
Figure 3B:
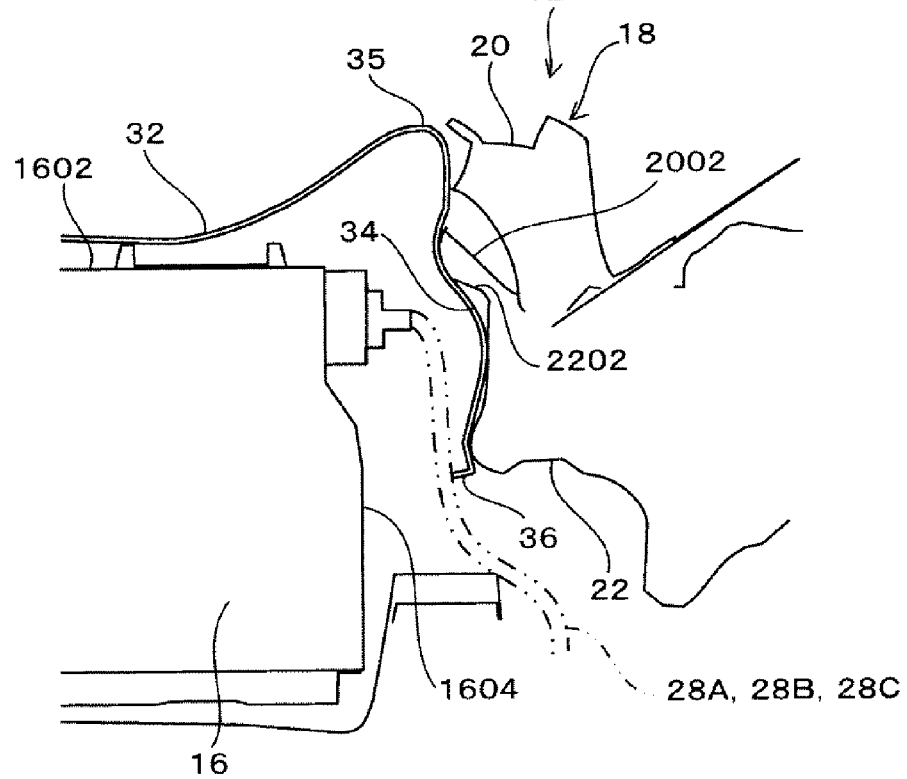
FIG. 3(B) is an enlarged view of a rear part of the inverter 16, when the vehicle comes into collision.

As shown in FIGS. 2, 3(A) and 3(B), the inverter 16 has an upper face 1602 in a substantially rectangular shape in a plan view. Four screw holes 1606 for mounting the cover are formed in the upper face 1602.

A rear face 1604 of the inverter 16 is directed to a rear side of the vehicle 10, and first to third connectors 26A, 26B, 26C for connecting harnesses (connecting parts) are provided in an upper part of the rear face 1604. First to third connectors (connecting parts) 27A, 27B, 27C which are provided at one ends of first to third harnesses 28A, 28B, 28C are respectively connected to these first to third connectors 26A, 26B, 26C.

The other end of the first harness 28A is connected to the battery, and supplies the direct current from the battery to the inverter 16.

The other end of the second harness 28B is connected to the driving motor, and supplies the alternating current which has been converted in the inverter 16, to the driving motor.

The other end of the third harness 28C is connected to a generator which is not shown, and receives an electric power which is generated in the generator.

As shown in FIGS. 1 to 3(B), the inverter cover 30 is mounted on the inverter 16.

The inverter cover 30 covers the inverter 16 and the connecting parts of the first to third harnesses 28A, 28B, 28C which are connected to the rear part of the inverter 16, from the above.

The inverter cover 30 is formed of material which is deformed when subjected to a stress. As such material, it is possible to use various materials conventionally known, such as synthetic resin.

Figure 4A:
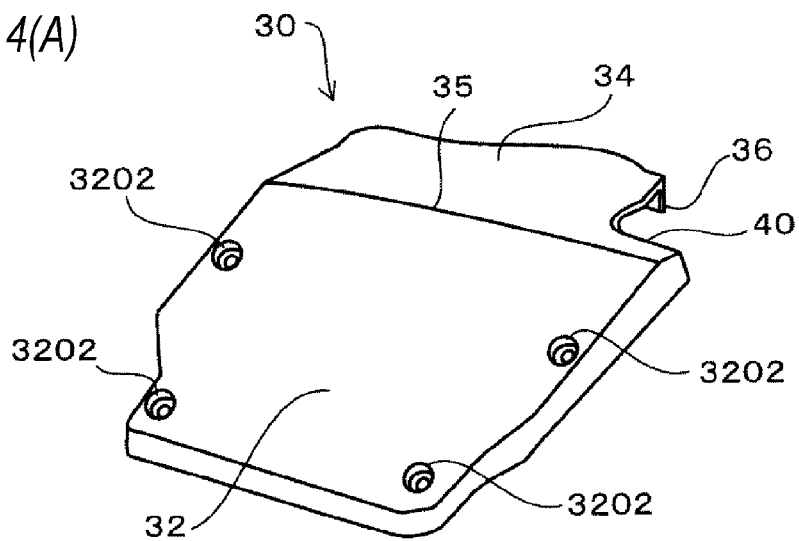
FIG. 4(A) is a perspective view of the inverter cover 30.
Figure 4B:
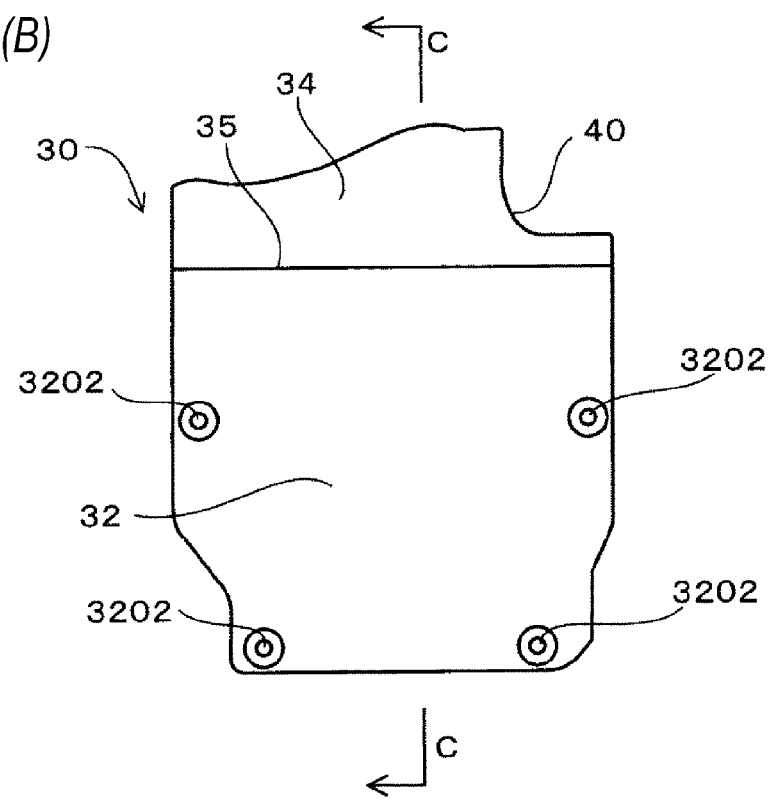
FIG. 4(B) is a plan view of the inverter cover 30.
Figure 4C:
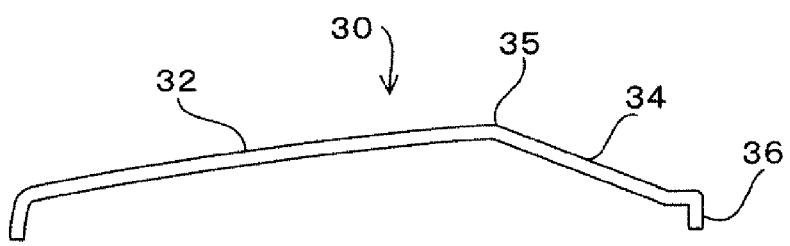
FIG. 4(C) is a sectional view taken along a line C-C in FIG. 4(B).

In this embodiment, the inverter cover 30 includes a body part 32, an extended part (a slanted part) 34, and a bent part (a guide part) 36, as shown in FIGS. 4(A) to 4(C).

The body part 32 covers an upper side of the inverter 16 and an upper side of the parts of the first to third harnesses 28A, 28B, 28C which are connected to the rear part of the inverter 16, and formed as a flat face which is displaced upward as going rearward.

Four screw inserting holes 3202 are formed through the body part 32 at respective positions corresponding to the four screw holes 1606 of the inverter 16.

Therefore, the inverter cover 30 is mounted on the inverter 16, by screwing screws which are passed through the screw inserting holes 3202, into the screw holes 1606 of the inverter 16.

The extended part (the slanted part) 34 is positioned between the first to third connectors (the connecting parts) 26A, 26B, 26C which are provided in the rear part of the inverter 16, and the edge part 24 of the vehicle body panel 12. The extended part (slanted part) 34 is also positioned between the first to third harnesses 28A, 28B, 28C which are connected to the rear part of the inverter 16, and the edge part 24 of the vehicle body panel 12.

The extended part (the slanted part) 34 which constitutes a wall part for protecting the harnesses is connected to a rear end of the body part 32 via a bending part 35 so as to be gradually displaced downward as going rearward. Therefore, the bending part 35 forms a border between the body part 32 and the extended part (the slanted part) 34. As seen in a plan view, the bending part 35 is positioned rearward than the connectors 26A, 26B, 26C for connecting the harnesses in the rear part of the inverter 16.

Moreover, in this embodiment, a rear end of the slanted part 34 is positioned lower than the edge part 24.

The bent part (the guide part) 36 which is bent downward is provided at the rear end of the slanted part 34. This bent part (the guide part) 36 is butted against the vehicle body panel 12, when the vehicle is collided from the front, thereby to guide the slanted part 34 downward. In this embodiment, the bent part (the guide part) 36 is formed by being bent downward. Moreover, the bent part (the guide part) 36 also has a function of guiding the air which has been warmed by the inverter downward, without directly applying the warmed air to the passenger compartment which is positioned in rear of the inverter.

It is to be noted that reference numeral 40 in the drawings represents a cutout which is formed in the inverter cover 30 for the purpose of avoiding interference with a filling port 6 for filling brake fluid of a brake cylinder.

Then, operation and effects of the inverter cover 30 will be described.

It is presumed that in a state where the inverter cover 30 is mounted on the inverter 16, as shown in FIGS. 1, 2, and 3(A), the other vehicle 10 or an object collides against the front part of the vehicle body.

Then, the front part of the vehicle is deformed, as shown in FIG. 3(B), and the inverter 16 and the inverter cover 30 are displaced rearward inside the front space S. At the same time, the parts of the first to third harnesses 28A, 28B, 28C which are connected to the rear part of the inverter 16 are also displaced rearward, following the inverter 16. On this occasion, the cowl top 18 is also deformed along with deformation of the front part of the vehicle.

Thereafter, the slanted part 34 of the inverter cover 30 comes into contact with the edge part 24 and a part of the cowl top 18 near the edge part 24.

More specifically, the guide part 36 is butted against a surface of the lower cowl top 22 to be guided downward, along with the rearward displacement of the inverter 16. After the slanted part 34 is bent downward, the rear part of the body part 32 and the slanted part 34 are curved and deformed, along with further rearward displacement of the inverter 16.

Finally, as shown in FIG. 3(B), the rear part of the body part 32 and the slanted part 34 which have been curved come into contact with the cowl top 18 and a part of the lower cowl top 22 which has been deformed, or come into contact with a part of the dash panel which is connected to the lower cowl top 22.

On this occasion, the slanted part 34 is positioned between those parts of the first to third harnesses 28A, 28B, 28C which are connected to the rear part of the inverter 16, and the edge part 24. Therefore, the parts of the first to third harnesses 28A, 28B, 28C which are connected to the rear part of the inverter 16 will not directly come into contact with the edge part 24, but indirectly come into contact with the edge part 24 via the slanted part 34.

Therefore, as compared with a case where the first to third harnesses 28A, 28B, 28C directly come into contact with the edge part 24, durability of the first to third harnesses 28A, 28B, 28C can be advantageously maintained.

In this embodiment, because the cowl top 18 is deformed, as shown in FIG. 3(B), the flange 2002 of the upper cowl top 20 and the flange 2202 of the lower cowl top 22 which form the edge part 24 are finally separated at a position where they are joined.

Therefore, according to this embodiment, the inverter cover 30 is provided with the slanted part 34 which is positioned between the parts of the first to third harnesses 28A, 28B, 28C which are connected to the rear part of the inverter 16, and the edge part 24 of the vehicle body panel 12. For this reason, when the vehicle comes into collision, the first to third harnesses 28A, 28B, 28C indirectly come into contact with the edge part 24 interposing the slanted part 34, which is advantageous in maintaining the durability of the first to third harnesses 28A, 28B, 28C.

Moreover, because the slanted part 34 is gradually displaced downward as going rearward, the slanted part 34 is likely to be curved downward, when butted against the vehicle body panel 12, while the inverter cover 30 is displaced rearward by the collision.

Therefore, as the slanted part 34 is curved downward, the parts of the first to third harnesses 28A, 28B, 28C which are connected to the rear part of the inverter 16 are enveloped in the slanted part 34, and the first to third harnesses 28A, 28B, 28C are protected by the slanted part 34. As the results, the durability of the first to third harnesses 28A, 28B, 28C can be advantageously maintained.

Moreover, the part 35 on the border between the slanted part 34 and the body part 32 is positioned rearward than the connectors for connecting the harnesses (the connecting parts) 26A, 26B, 26C which are positioned in the rear part of the inverter 16. For this reason, in the event of collision, the slanted part 34 is likely to be curved downward in rear of the harness connecting connectors 26A, 26B, 26C, and the parts of the first to third harnesses 28A, 28B, 28C which are connected to the inverter 16 are enveloped in the slanted part 34. As the results, the first to third harnesses 28A, 28B, 28C are protected by the slanted part 34, and the durability of the first to third harnesses 28A, 28B, 28C can be advantageously maintained.

Moreover, in this embodiment, a slanting degree of the slanted part 34 is different from that of the body part 32, and therefore, the slanted part 34 is likely to be curved downward from the part 35 on the border between the slanted part 34 and the body part 32. As the results, the durability of the first to third harnesses 28A, 28B, 28C can be more advantageously maintained.

Moreover, because the guide part 36 is provided at the rear end of the slanted part 34, the guide part 36 is guided downward by the vehicle body panel 12, when the guide part 36 comes into contact with the vehicle body panel 12. For this reason, the slanted part 34 is also likely to be curved downward, and the parts of the first to third harnesses 28A, 28B, 28C which are connected to the inverter 16 are enveloped in the slanted part 34. As the results, the first to third harnesses 28A, 28B, 28C are protected by the slanted part 34, and the durability of the first to third harnesses 28A, 28B, 28C can be more advantageously maintained.

Moreover, in this embodiment, the invention has been described referring to a case where the edge part 24 of the vehicle body panel 12 protruding toward the front space S includes the flange 2002 of the upper cowl top 20 and the flange 2202 of the lower cowl top 22. However, the edge part 24 is not limited to the flanges 2002, 2202, but may be extensively applied to the edge part 24 which is provided on the vehicle body panel 12.

Moreover, in this embodiment, the invention has been described referring to a case where the guide part 36 has a shape of being bent at a right angle from the slanted part 34. However, the guide part 36 may be curved, for example, in a semi-cylindrical shape. In short, it would be sufficient that the guide part 36 is so shaped as to be guided downward when it comes into contact with the vehicle body panel 12.

Moreover, in this embodiment, the invention has been described referring to a case where the vehicle 10 is the hybrid car. However, it is apparent that the invention can be applied to the electric car in which only the driving motor is used as the drive source. Therefore, the invention is extensively applied to the motor-driven cars such as the electric car and the hybrid car.

DESCRIPTION OF THE REFERENCE NUMERALS AND SIGNS

S Front space
2 Hood
4 Radiator
10 Vehicle
12 Vehicle body panel
14 Engine
16 Inverter
1602 Upper face
1604 Rear face
1606 Screw hole
18 Cowl top
20 Upper cowl top
2002 Flange
22 Lower cowl top
2202 Flange
24 Edge part
26A First connector (connecting part)
26B Second connector (connecting part)
26C Third connector (connecting part)
27A First connector (connecting part)
27B Second connector (connecting part)
27C Third connector (connecting part)
28A First harness
28B Second harness
28C Third harness
30 Inverter
32 Body part
3202 Screw inserting hole
34 Extended part (Slanted part)
35 Bending part
36 Bent part (guide part)
40 Cutout

The invention claimed is:
1. An inverter cover for covering an inverter provided in a front space formed in front of a passenger compartment in a longitudinal direction of a vehicle, the front space being partitioned from the passenger compartment by a vehicle body panel having an edge part that extends in a forward direction towards the inverter, the inverter cover comprising:

a body part that covers an upper face of the inverter; and an extended part extending in a rearward direction from a rear end of the body part, the extended part covering, from above, a connecting part of the inverter formed in a rear portion of the inverter for connecting a harness, and extending between the connecting part and the edge part of the vehicle body panel, wherein a front end of the extended part is positioned higher than the edge part and a rear end of the extended part is positioned lower than the edge part, such that the extended part is configured to make contact with the edge part upon collision of the vehicle so that the extended part can deform in a downward direction to protect the harness.

2. The inverter cover as claimed in claim 1, wherein the extended part is slanted such that a height of the extended part becomes lower as the extended part extends toward a rear of the vehicle.

3. The inverter cover as claimed in claim 1, further comprising:

a border between the body part and the extended part, and the border is positioned between a rear end of the connecting part of the inverter and the vehicle body panel.

4. The inverter cover as claimed in claim 1, further comprising:

a bent part provided at the rear end of the extended part, the bent part extends in the downward direction from the rear end of the extended part.

5. The inverter cover as claimed in claim 1, wherein only the rear end of the extended part overlaps the edge part in a height direction of the vehicle.

\* \* \* \* \*